United States Patent
Rangelow et al.

(10) Patent No.: US 8,128,282 B2
(45) Date of Patent: Mar. 6, 2012

(54) MICROSYSTEM COMPONENT WITH A DEVICE DEFORMABLE UNDER THE EFFECT OF TEMPERATURE CHANGES

(75) Inventors: Ivo Rangelow, Baunatal (DE); Tzvetan Ivanov, Ilmenau (DE); Katerina Ivanova, Ilmenau (DE)

(73) Assignee: Universitaet Kassel, Kassel (DE)

( * ) Notice: Subject to any disclaimer, the term of this patent is extended or adjusted under 35 U.S.C. 154(b) by 741 days.

(21) Appl. No.: 11/813,308

(22) PCT Filed: Jan. 4, 2006

(86) PCT No.: PCT/DE2006/000016
§ 371 (c)(1),
(2), (4) Date: Dec. 22, 2008

(87) PCT Pub. No.: WO2006/072237
PCT Pub. Date: Jul. 13, 2006

(65) Prior Publication Data
US 2009/0213900 A1    Aug. 27, 2009

(30) Foreign Application Priority Data
Jan. 5, 2005    (DE) .................... 10 2005 001 116

(51) Int. Cl.
*G01K 5/62*    (2006.01)
(52) U.S. Cl. ........................ 374/204; 374/120

(58) Field of Classification Search ................ 33/43, 44, 33/45, 55, 120, 121, 204, 205, 206, 207; 374/43, 44, 45, 55, 120, 121, 204, 205, 206, 374/207
See application file for complete search history.

(56) References Cited

U.S. PATENT DOCUMENTS
2,573,686 A * 11/1951 Blinn et al. ................. 374/205
(Continued)

FOREIGN PATENT DOCUMENTS
DE    103 07 561    9/2004
(Continued)

OTHER PUBLICATIONS

P.G. Datskos, N. V. Lavrik, S. Rajic, "Performance of Uncooled Microcantilever Thermal Detectors" Review of Scientific Instruments, vol. 75, No. 4, Apr. 2004, p. 1134-1148.
Reich et al, "Halbleitersensoren" [Semiconductor Sensors], Expert-Verlag, 1989, p. 225.

(Continued)

*Primary Examiner* — G. Bradley Bennett
(74) *Attorney, Agent, or Firm* — Michael J. Striker (57) ABSTRACT

A microsystem component with a device (3) deformable under the influence of temperature changes is disclosed. The device comprises at least one first (4, 5) and second (8) element with differing thermal expansion coefficients and different thermal conductivities. The elements (4, 5; 8) are physically separate and arranged and connected to each other such that the device (3) assumes flexure states which are dependent on the temperature.

22 Claims, 12 Drawing Sheets

U.S. PATENT DOCUMENTS

| | | |
|---|---|---|
| 4,882,245 A | 11/1989 | Gelorme et al. |
| 6,805,839 B2 | 10/2004 | Cunningham et al. |
| 2001/0052570 A1 | 12/2001 | Ishizuya et al. |
| 2003/0091092 A1* | 5/2003 | Engel et al. .................. 374/179 |
| 2006/0238206 A1 | 10/2006 | Eng et al. |
| 2009/0168842 A1* | 7/2009 | Yokoi et al. .................. 374/208 |

FOREIGN PATENT DOCUMENTS

| | | |
|---|---|---|
| WO | 00/40938 | 7/2000 |

OTHER PUBLICATIONS

T. Gotszalk, J. Radojewski, P.B. Grabiec, P. Dumania, F. Shi, P. Hudek and I.W. Rangelow "Fabrication of Multipurpose Piezoresistive Wheatstone Bridge Cantilevers With Conductivbe Microtips for Electrostatic and Scanning Capacitance Microscopy". J. Vac. Sci. Technol. B 16(6), Nov./Dec. 1998, p. 3948-3953.

IW. Rangelow, P.B. Grabiec, T. Gotszalk and K. Edinger "Piezoresistive SXM Sensors". SIA 1162, 2002, pp. 3948-3953.

* cited by examiner

MICROSYSTEM COMPONENT WITH A DEVICE DEFORMABLE UNDER THE EFFECT OF TEMPERATURE CHANGES

The invention relates to a microsystem component of the type specified in the preamble of claim 1.

Known components of this type include a cantilever configured in the manner of a bimetallic strip as deformable device. This is fixedly secured at its one end to a holding body, whereas its other end is arranged to be freely movable. Depending on the temperature conditions, the cantilever assumes a more or less significantly curved bending state.

Electromagnetic radiations, in particular in the form of infrared or thermal rays hereafter abbreviated to IR rays, serve as heat sources for such a component (e.g. U.S. Pat. No. 6,805,839 B2 and P. G. Datskos, N. V. Lavrik, S. Rajic in "Performance of uncooled microcantilever thermal detectors", Review of Scientific Instruments, Vol. 75, No. 4, April 2004, pages 1134 to 1148). In this case the component serves as an IR sensor, preferably for wavelength ranges from 1 μm to 20 μm, although the application of such sensors is not restricted to specific wavelength ranges. The function method of the component consists in directing the heat of the cantilever caused by absorption of the radiation to a characteristic bending, which can serve as dimension for the amount of heat absorbed. Such sensors are widely used, above all, in the electrical engineering industry in the form of cantilever arrays in IR cameras and in the military field, but also, for example, in medicine, in the building industry or in research. Their particular advantage is that, in contrast to other IR sensors, they can be applied without any special cooling system.

In another type of application, the described component is configured as a microactuator (e.g. DE 103 07 561 A1). For this purpose, the component is provided, for example, with a heat source in the form of an electric heating element. In this case, its function method consists in generating a controlled local heating in the cantilever by passing an electric current through the heating element and thus forcing a preselected bending state. Such actuators are applied, for example, in conjunction with atomic force microscopes operating according to the AFM (atomic force microscopy) method and/or are used for combined scanning and examination of microsystem components having electrical contacts.

Other applications in the micro-electrical/optical/mechanical field are also possible.

The known cantilevers configured in the manner of bimetallic strips are not completely satisfactory with respect to their sensitivity, their response speed and their thermal insulation. The main reason for this is that with many suitable materials the coefficient of thermal expansion and the heat conductivity are either both relatively high or both relatively low. This results in a desirably large difference between the coefficients of thermal expansion of the materials concerned being simultaneously associated with a high heat conduction of at least one of the two materials, which leads to a quick discharge of the absorbed heat, and either requires costly insulation measures or impairs the sensitivity and response speed. This is problematic in particular with applications, in which a plurality of such components are used, e.g. in IR cameras.

Therefore, the technical problem to be solved by the invention is to configure the component of the aforementioned type such that it has a high sensitivity, does not require costly insulation and responds quickly to temperature changes, while still being inexpensive to produce and not requiring any cooling.

This problem is solved by the features of claim 1.

While in previous components the deformable device indeed includes a cantilever configured in the manner of a layered body, in which the materials having different coefficients of thermal expansion form superposed layers, the invention proposes a structure of the deformable device that differs from this. The spatial separation of the materials causing the deformation leads to a completely new design that allows different geometries and a better thermal insulation. Moreover, the deformable device can be produced in the form of an extremely thin structured chip, which improves the response speed. Moreover, the new design allows additional integration of detectors intended for measurement of the deformation as well as a simple adjustment of the component to a preselected wavelength range without significant structural and/or cost disadvantages.

Further advantageous features of the invention may be seen from the sub-claims.

The invention is explained in more detail below on the basis of exemplary embodiments in association with the attached drawings.

Figure 1:
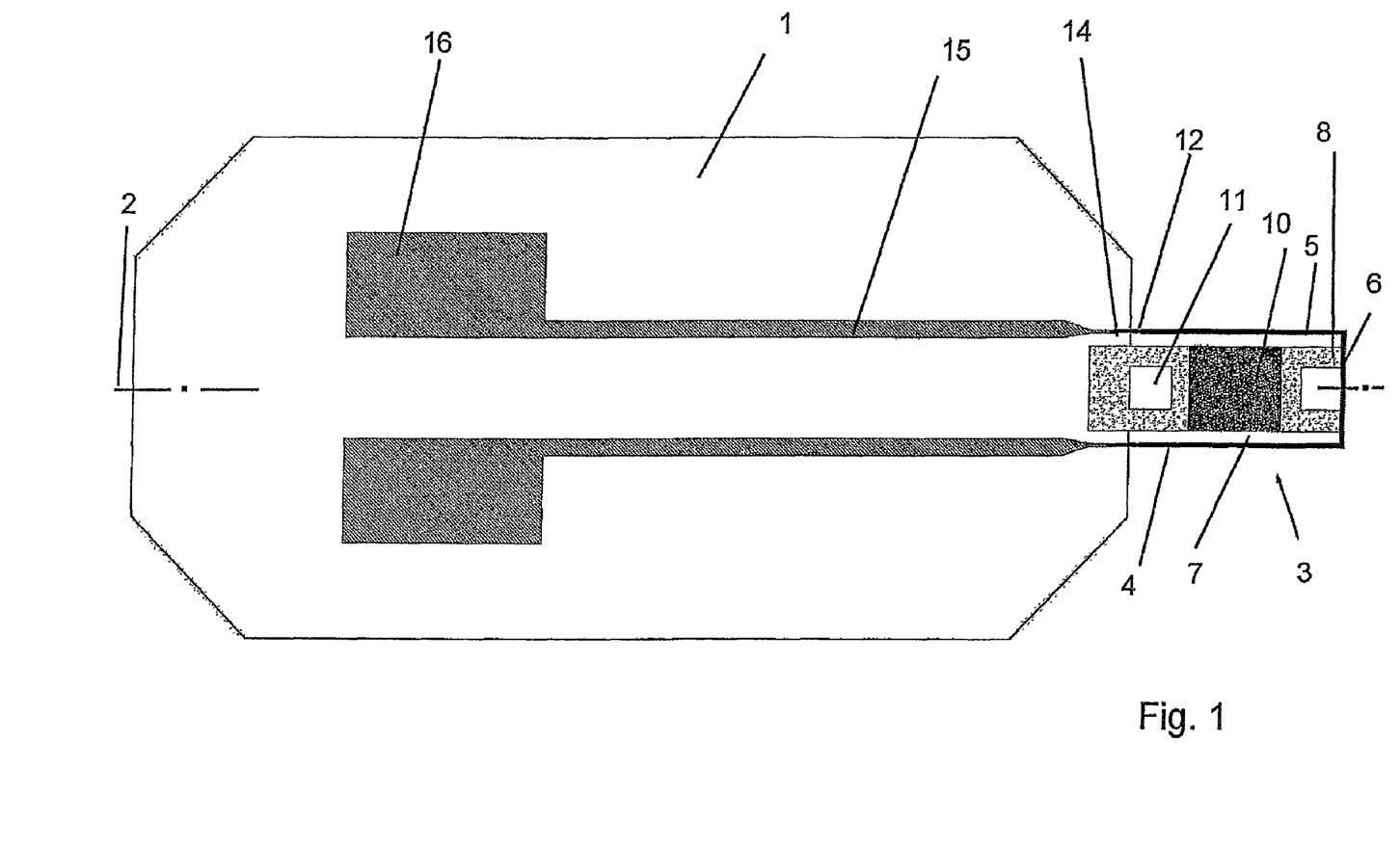
FIG. 1 is a schematic plan view onto a microsystem component according to the invention in the form of an IR sensor.
Figure 2:
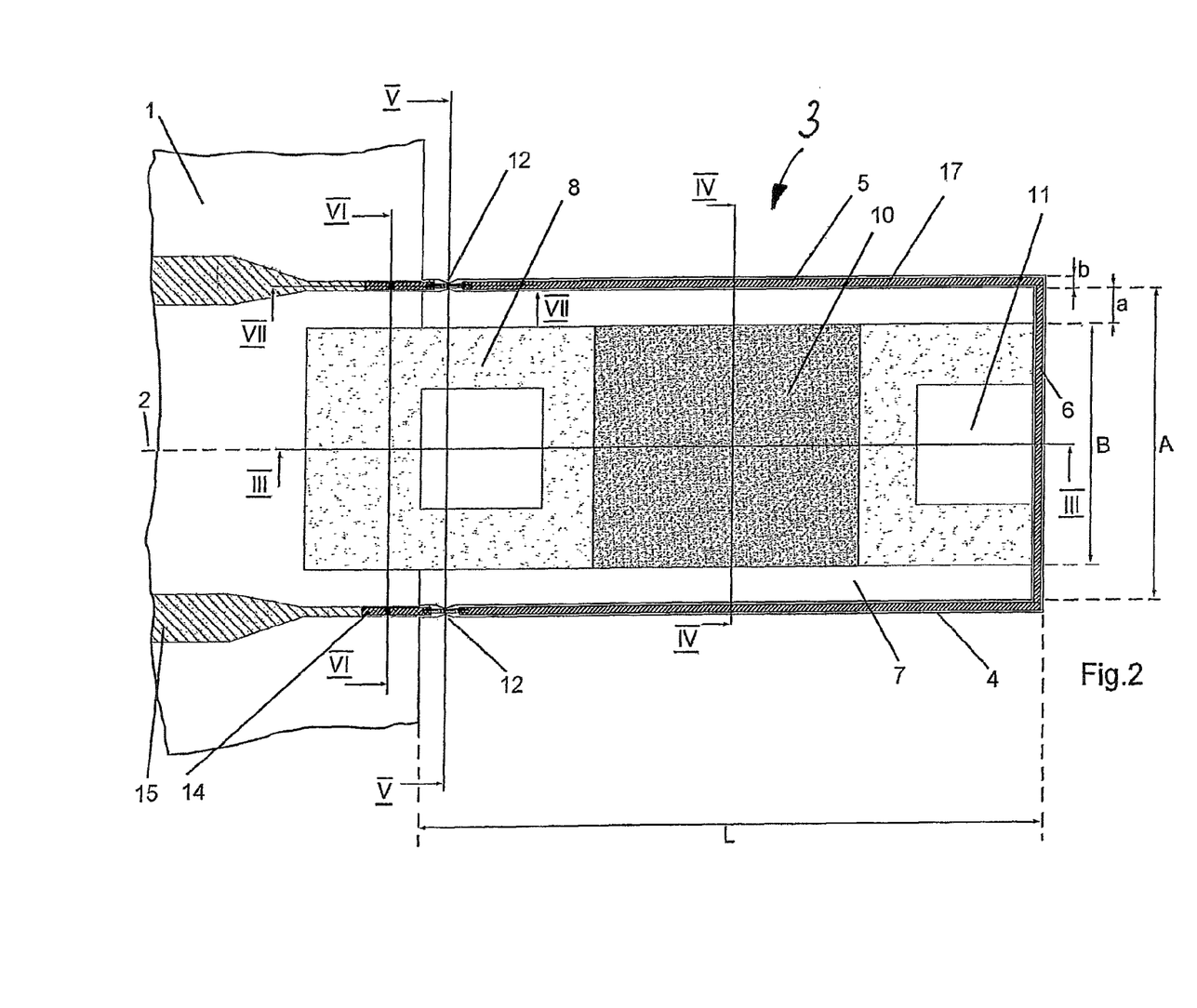
FIG. 2 is an enlarged plan view in particular onto a device that is deformable under the effect of temperature changes according to FIG. 1.

The microsystem component of the present invention shown in FIG. 1 contains a base and holding body 1 with a longitudinal axis 2. A longitudinal end of a deformable device 3 shown in particular in FIG. 2 is rigidly secured to a longitudinal end of the base body 1 and its other longitudinal end remote from the longitudinal axis 2 of the base body 1 is arranged to be freely movable. In the exemplary embodiment, the device 3, and thus the entire component, is configured as a sensor for electromagnetic radiation, in particular for IR radiation, and for this purpose is configured so that the temperature changes caused by the radiation at the location of the component can be measured.

Figure 3:
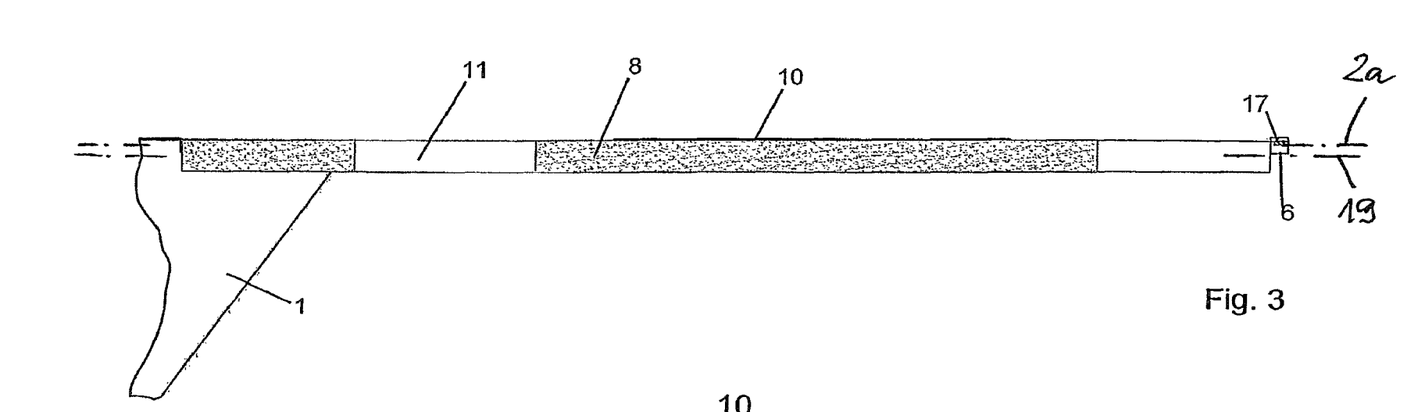
FIG. 3 shows an enlarged longitudinal section through the deformable device taken along line III-III in FIG. 2.
Figure 4:
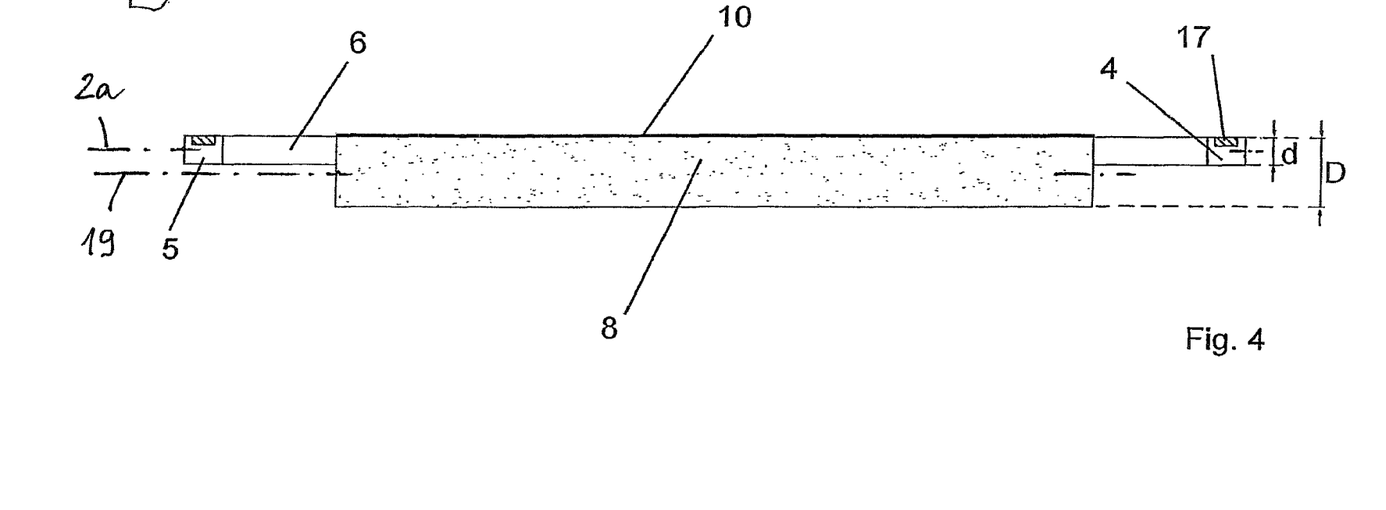
FIGS. 4-6 show enlarged cross-sections through the deformable device taken along lines IV-IV to VI-VI in FIG. 2.
Figure 5:
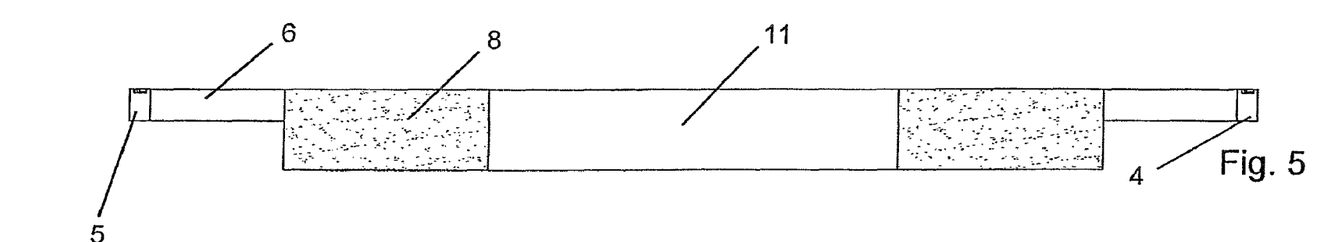
Figure 6:
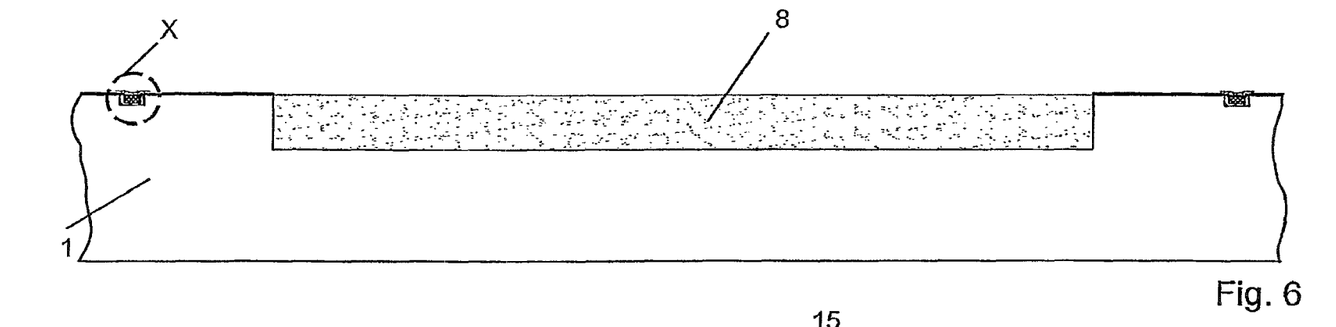

The device 3 contains at least one first bendable element 4 in the form of a comparatively narrow elongated material strip or web that is expediently arranged parallel to the longitudinal axis 2. As in the exemplary embodiment, a further first bendable element 5 is preferably provided that is expediently arranged at a preselected spacing and parallel to the element 4 and is configured like this. Elements 4 and 5 are rigidly secured to the base body 1 respectively at their one end, on the left in FIG. 2, whereas the other ends of elements 4 and 5 remote from these are fixedly connected to an end section 6, which expediently is made of the same material and is configured with the same cross-sectional shape and size as elements 4, 5. Because of this configuration, elements 4, 5 and the end section 6 together with the associated longitudinal end of the base body 1 form a frame, which surrounds an opening 7 and has a centre plane 2a enclosing the longitudinal axis 2 (FIG. 2) and arranged substantially perpendicularly to the drawing plane in FIGS. 3 and 4. According to FIGS. 1 and 2, the frame is substantially rectangular in plan view, but other frame forms are naturally also possible.

Moreover, the device 3 contains at least one second, likewise bendable element 8, which is arranged between the two first elements 4, 5 and like these is preferably arranged parallel to the longitudinal axis 2 and spans the opening 7 on its entire length parallel to the longitudinal axis 2. One end of this second element 8 is rigidly secured to the base body 1, while its other end is fixedly connected to the end section 6. In this case, the dimensions according to FIG. 2 are selected such that the second element 8 has a width B measured transversely to the longitudinal axis 2 that is smaller overall than a clearance A between the two elements 4 and 5. On the other hand, the second element 8 is arranged between the two first elements 4 and 5 in such a way that a clearance a that does not exceed a preselected dimension is provided overall both between elements 4 and 8 and between elements 5 and 8. In addition, the second element 8 preferably has a width B substantially larger, e.g. more than 10-times larger, than the width b likewise measured perpendicularly to the longitudinal axis 2, so that overall it has the shape of a plane-parallel plate. As a result, the first elements 4, 5 are significantly easier to bend than the second element 8. Finally, it is obvious that the second element 8 could also comprise several correspondingly narrower sections arranged parallel to the longitudinal axis 2 without changing the clearance a as a result.

The first and second elements 4, 5 and 8 have different coefficients of thermal expansion and thermal conductivities. This provides the advantage that a high response speed may be achieved for the device 3 whatever the dimensions of the elements 4, 5 and 8 selected for the individual case. The coefficient of expansion of the first elements 4, 5 is preferably substantially lower than that of the second element 8. Conversely, the situation is preferably reversed with respect to the thermal conductivity, i.e. the second element 8 has a substantially lower thermal conductivity than the first elements 4 and 5. Therefore, the second element 8 is heated, for example, by absorption of an IR radiation, then in comparison to elements 4, 5 expands substantially more significantly parallel to the longitudinal axis 2 than elements 4, 5. However, since the second element 8 is rigidly secured to the base body 1, on the one hand, and fixedly connected to the end section 6 also fastened to the first elements 4, 5, on the other, this linear expansion is converted into a corresponding bending of all elements 4, 5 and 8 present, as is shown schematically in FIG. 9. Since the first elements 4, 5 are also rigidly secured to the base body 1, they will deform substantially continuously towards one or the other side, while at the same time the second element 8 is in itself deformed in a wave shape, as a result of which the end section 6 is subject to a corresponding deflection perpendicularly to a preselected zero plane formed, for example, by the centre plane 2a that contains the longitudinal axis 2.

A substantial advantage of the described device 3 is that the second element 8 is spatially separated from the first elements 4, 5 by the clearances a. Moreover, since the second element 8 has only a low thermal conductivity, the heat adsorbed by it can readily discharge to the base body 1, even if this and/or the first elements 4, 5 and/or the end section 6 are made of a material of comparatively high thermal conductivity such as silicon, for example. A heat discharge via the narrow elements 4, 5 and the end section 6, which is preferably configured to be just as narrow as elements 4, 5, is also at least largely hindered.

It is particularly advantageous if on a wide side intended for absorption of the radiation, the second element 8 is provided with a highly thermally conductive absorber 10 that absorbs the radiation and supplies the generated heat to the second element 8 over a wide surface, as a result of which this is expanded. The absorber 10 is preferably arranged in a central region of the second element 8—viewed in the direction of the longitudinal axis 2. In order to prevent the absorbed heat from discharging to the base body 1 and/or to the end section 6 despite the poor thermal conductivity of the second element 8 and despite the gap with the width a, the second element 8 is expediently provided with at least one hole 11, which is formed in a region arranged between the absorber 10 and the base element 1 or the absorber 10 and the end section 6. In this way, a very good thermal insulation of the second element 8 in relation to the other parts of the device 3 is achieved and assured, so that the absorbed radiation or heat is optimally converted into a longitudinal expansion of the element 8.

In principle, the measurement of the deformation or bending of device 3 or elements 4, 5 and 8 can be performed in different ways, e.g. with optical or capacitive elements. According to the invention, it is proposed to measure the deflection of the first elements 4, 5 or the frame formed by these by means of piezoresistive detectors. A piezoresistive detector 12 is respectively installed in at least one of the first elements 4 and 5, but preferably in both first elements 4 and 5 according to FIG. 2, for this purpose (cf. also FIG. 8). The detector 12 is expediently provided close to the fixed end of the respective element 4, 5. Such a detector 12 allows, inter alia, the mechanical stress acting locally on the respective element 4, 5 to be calculated, since the resistance of the detector 12 changes in accordance with the formula $$\Delta R/R = \delta_l \Pi_l + \delta_t \Pi_t.$$

Herein, R is the resistance of detector 12, $\Delta R$ the change in resistance, $\delta_l$ and $\delta_t$, the lateral or transverse stress components and $\Pi_l$ and $\Pi_t$, the transverse or lateral piezoresistive coefficients (cf. Reichl et al. in "Halbleitersensoren" [semiconductor sensors], expert-Verlag 1989, page 225, for example). The detector 12 is preferably arranged at a location of the element 4, 5 where the highest mechanical stresses result in order to obtain a high signal-to-noise ratio.

Figure 7:
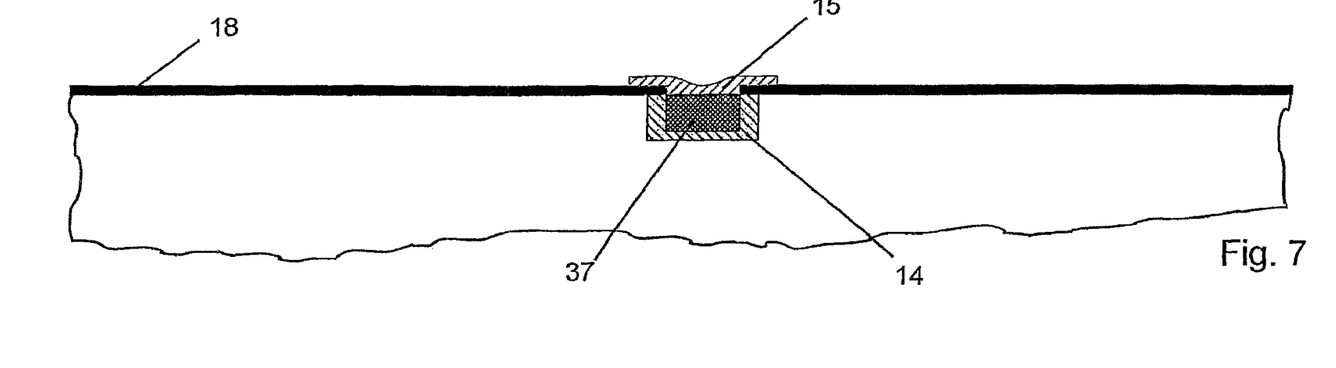
FIG. 7 shows a highly enlarged detail X from FIG. 6.
Figure 8:
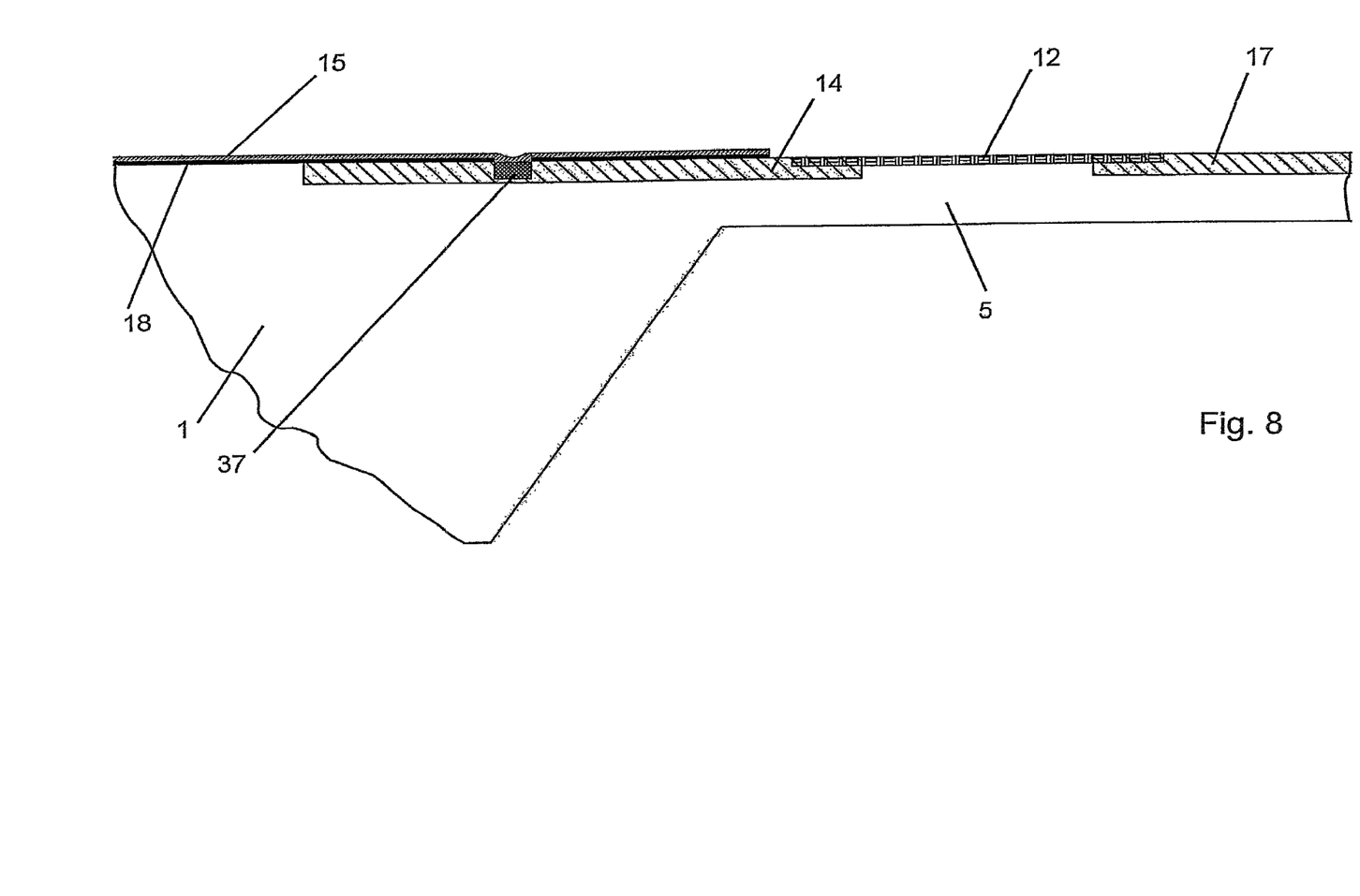
FIG. 8 shows an enlarged section through the deformable device taken along line VIII-VIII in FIG. 2.

According to FIGS. 1, 2 and 8, the two detectors 12 are connected in series. For this purpose, one connection of each detector 12 is connected to an electric lead 14, which extends as far as the base body 1 and is connected to a strip conductor 15 laid on the upper side of the base body 1 leading to a contact surface (pad) 16 (FIG. 1) also arranged on the surface of the base body 1, while the other ends of the two detectors 12 are interconnected by means of an electric lead 17 (FIGS. 2 and 8). The leads 14 and 17 are preferably laid on the upper wide side of the base body 1 and also of elements 4, 5 and end section 6 or embedded into these. In addition, the leads 14, 15 and 17 as well as the contact surfaces 16 are arranged or configured to be electrically insulated relative to one another and also relative to other conductive parts of the component. For this, according to FIGS. 7 and 8, for example, a layer 18 of silicon nitride ($Si_3N_4$) is provided between lead 14 and the strip conductor 15 to connect the leads 14, 15 to one another.

To improve sensitivity during measurement of the bending states of elements 4, 5, these are expediently provided with reduced cross-sections in the areas where the piezoresistive detectors 12 are arranged, as clearly shown in FIG. 2 in particular.

An important advantage of the described measurement device is that besides the spatial separation, it also allows separation of the functions. While the second element 8 serves in particular to absorb radiation and for linear expansion, the first elements 4, 5 are mainly used to detect and measure the deformation of the first elements 4, 5 or of the frame formed by these transversely to the centre plane 2a or in the direction of their thickness d. Therefore, the first and second elements 4, 5 and 8 can be optimised with respect to their functions without any interfering effect on one another.

The described parts of the component can be made from numerous different materials. In a particularly effective practical example currently considered to be the best, the base body 1, the first elements 4, 5 and the end section 6 consist of a silicon chip manufactured in one piece. In contrast, the second element is made of a polymer (epoxy resin) generally known under the trade mark "SU-8" and hitherto used predominantly as photoresist in photolithography (cf. U.S. Pat. No. 4,882,245). The invention utilises the circumstance that silicon has a comparatively low coefficient of thermal expansion ($\alpha \approx 2.61 \cdot 10^{-6} \cdot K^{-1}$) and a comparatively high thermal conductivity ($\kappa \approx 148$ W/mK), while the material SU-8 has a comparatively high coefficient of thermal expansion ($\alpha \approx 52 \cdot 10^{-6} \cdot K^{-1}$), but an extremely low thermal conductivity ($\kappa \approx 0.2$ W/mK). Finally, gold is preferably used as material for the absorber 10, its thermal conductivity being very high at $\kappa \approx 314$ W/mK, so that the absorbed radiation heat is passed very quickly to the second element 8. The thermal expansion of the absorber 10 is less significant here. A further advantage is that the element 8 produced from SU-8 can be produced with a comparatively large thickness of 10 μm to 20 μm, for example, so that it is solid and stable.

The dimensions of the different parts of the described device 3 are preferably as follows (the chosen references can be seen from FIGS. 2 and 4):

1. thickness d of the first elements 4, 5 and the end section 6 approx. 1 μm to 7 μm;
2. thickness D of the second element 8 approx. 2 μm to 10 μm;
3. thickness b of the first elements 4, 5 and the end section 6 approx. 10 μm to 15 μm;
4. width B of the second element 8 approx. 200 μm;
5. width a of the air gaps between the first elements 4, 5 and the second element 8 approx. 5 μm to 15 μm;
6. length L of the device 3 from the base body 1 approx. 550 μm.

Deflections of the end section 6 to approx. 2 μm per 1° K with a sensitivity of 1 μV per 1 nm of deflection are measured with such a device 3. Because the first elements 4, 5 are thinner than the second element 8 and a centre plane 19 of the second element 8 is arranged at a distance from the centre plane 2a of the first elements 4, 5 or the frame formed by these (FIGS. 3 and 4), it is possible to cause the bending to occur in a preferred direction (vertically upwards in FIG. 3, for example).

In the production of 2 D arrays, e.g. for IR cameras, the specified dimensions can be considerably reduced in order to obtain a deformable device 3 with the total dimensions of length approx. 100 μm, width approx. 20 μm and thickness approx. 1 μm.

If the intention is to adjust the described IR sensor selectively to a specific wavelength range, this can be achieved, for example, by selecting the absorber material, e.g. by using aluminium nitride (AlN) or silicon nitride ($SiN_x$) instead of the gold covering suitable for broad band purposes. As a result, it is possible, for example, to adjust the IR sensor to low wavelength ranges within a total range of 1 μm to 20 μm and to distinguish animals from humans, for example, on IR images.

In principle, other materials are also suitable for the first and second elements 4, 5 and 8, e.g. two metals with correspondingly different coefficients of expansion and thermal conductivities. In particular, aluminium or $SiN_x$ could also be used for the second element 8 instead of SU-8. However, besides having a good thermal expansion, aluminium also has a high thermal conductivity, which is undesirable, whereas while $SiN_x$ has a lower thermal conductivity, it has an undesirably low thermal expansion. In comparison, the material SU-8 has a high thermal expansion and at the same time a low thermal conductivity.

Figure 9:
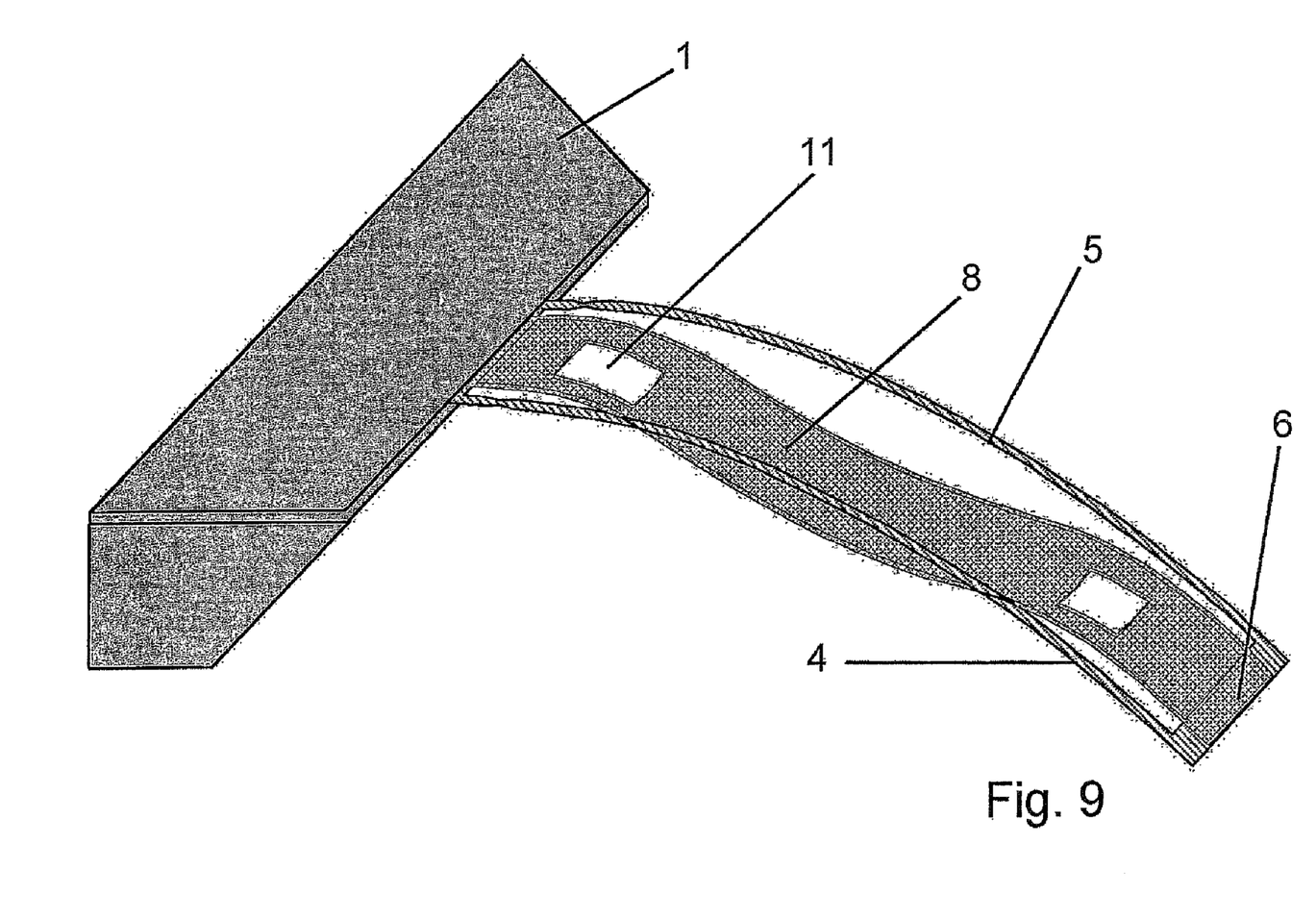
FIG. 9 is a schematic perspective representation of the working principle of the deformable device according to FIGS. 1 to 8.
Figure 10:
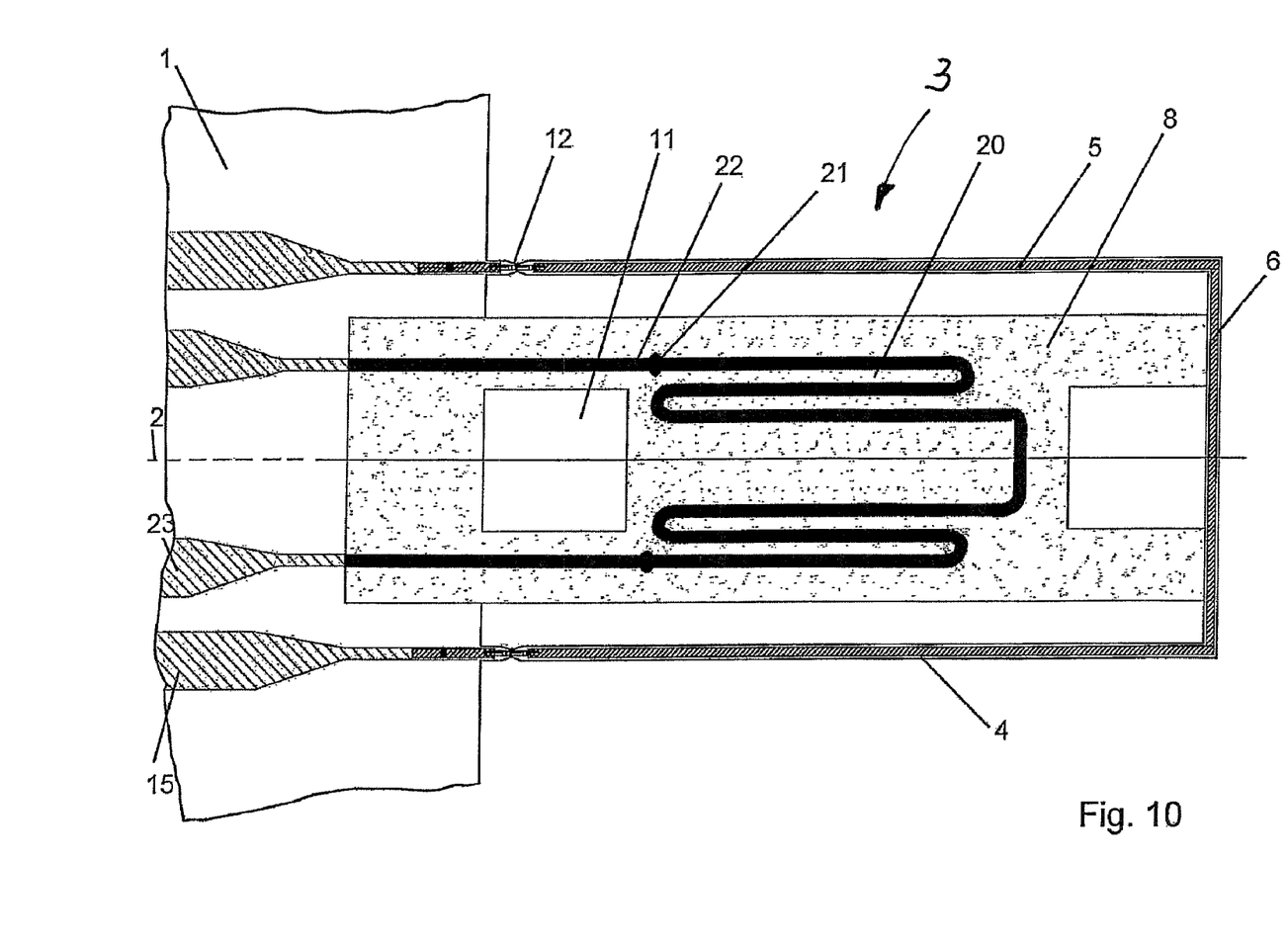
FIG. 10 is a schematic plan view onto a microsystem component according to the invention in the form of an actuator.

FIG. 10 schematically shows a component that essentially corresponds to the component according to FIGS. 1 to 9, but is configured as an actuator. In contrast to FIGS. 1 to 9, the second element 8 of the device 3 is not fitted with an absorber 10 here, but with an electric heating element 20, which has two connections 21 that are connected via electric leads 22 arranged on the upper side of the second element 8 to electrical strip conductors 23, which are provided on the upper wide side of the base body 1 and lead to contact surfaces (not shown) that are likewise arranged on the surface of the base body 1. The strip conductors 23 and contact surfaces essentially correspond to the strip conductors 15 and contact surfaces 16 for the detectors 12, but are electrically insulated relative to these. The device 3 can be actively deformed in a controlled manner because an electric current is conducted through the heating element 20 from the outside. The heating element 20 comprises, for example, a resistance heating element or a heating filament or the like laid flat or in a spiral shape, which causes local heating of the second element 8 when an electric current is conducted through it. Moreover in this case, the element 8 can be provided with a typical tip (not shown) for cantilever applications (cf. DE 103 07 561 A1).

The strip conductors 15, 23 and the contact surfaces 16 are preferably made of highly conductive material such as aluminium, gold, titanium or alloys thereof, for example, and are attached to the surface of the base body 1, which preferably comprises a silicon body, which is produced in one piece together with the first elements 4, 5 and can be provided with a protective layer of silicon dioxide ($SiO_2$). The leads 14, 17 are preferably embedded in the surface of the first elements 4, 5 and are produced, for example, from highly conductive p-type zones (p+) in the silicon base material. The heating element 20 and the leads 22 can comprise an aluminium microwire or the like integrated into the element 8.

The production of the described components is indicated schematically in FIGS. 11 to 19 and can be achieved with the processes known in microsystem cantilever production [e.g. T. Gotszalk, J. Radojewski, P. B. Grabiec, P. Dumania, F. Shi, P. Hudek and I. W. Rangelow in "Fabrication of multipurpose piezoresistive Wheatstone bridge cantilevers with conductive microtips for electrostatic and scanning capacitance microscopy", J. Vac. Sci. Technol. B 16 (6), November/December 1998, pp. 3948-3953 or I. W. Rangelow, P. B. Grabiec, T. Gotszalk and K. Edinger in "Piezoresistive SXM Sensors", SIA 1162, 2002, pp. 3948-3953]. An n-conducting silicon wafer or slice 26 polished on both sides, the plane-parallel wide sides of which are configured as (100)-surfaces and which is firstly provided at least on its upper width with a thermally applied $SiO_2$ protective layer 27, is used as starting material according to FIGS. 11 and 12. The silicon slice 26 is processed according to the so-called mesa technique, for example.

Figure 11:
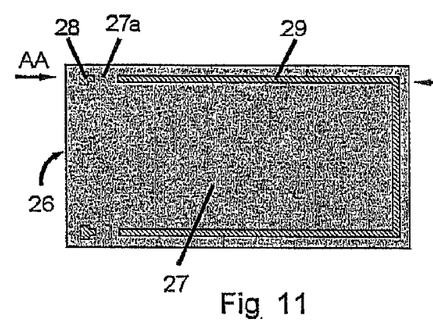
FIGS. 11-19 are schematic plan views and sectional views illustrating the production of the component according to FIGS. 1 to 9.
Figure 12:
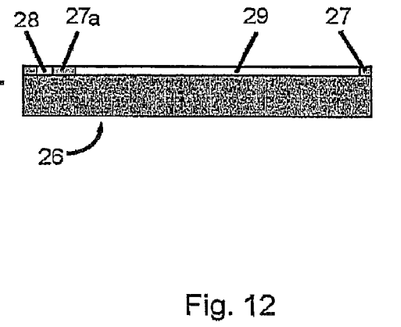

In the exemplary embodiment, windows 28, 29 are firstly worked into the protective layer 27 located on the upper wide side by standard lithographic and etching processes (FIGS. 11 and 12). Boron is then diffused with a high doping level, for example, through the windows 28, 29 into the silicon slice 26 or inserted by ion implantation in order to generate p+-conducting layers 30, 31 (FIGS. 13, 14) below the windows 28, 29 that are to form the leads 14 and 17 in FIGS. 7 and 8. In a corresponding way and possibly simultaneously with the layers 30, 31, the heating element 20 and the leads 22 of the actuator according to FIG. 10 can be configured with possibly different doping levels, preferably embedded in the semiconductor slice 26 and produced for this purpose by deep implantation or diffusion.

Figure 15:
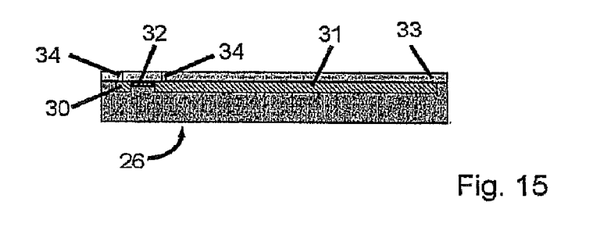
Figure 16:
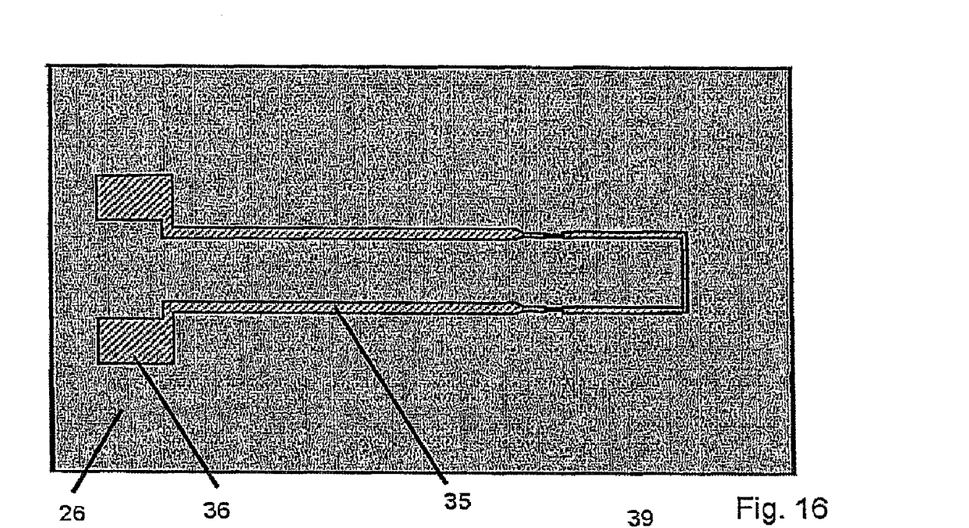

After further lithographic and etching steps to remove an $SiO_2$ web 27a (FIG. 12) remaining between the windows 28, 29, the two layers 30, 31 are connected to one another by means of a p-conducting layer 32 (FIG. 14), which is attached like layers 30, 31, but with a lower doping level, and is activated, for example, by heating or the like and then forms the piezoresistive detector 12 (FIG. 8). The layers 30, 31 and 32 are then covered with a thermally applied $SiO_2$ protective layer 33 (FIG. 15).

Figure 13:
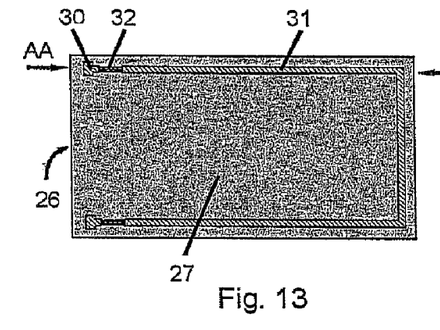
Figure 14:
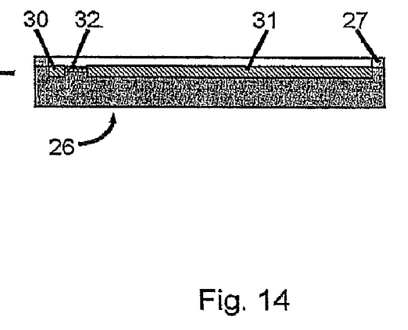

By application of analogous process steps (lithography, oxide etching etc.), those sections of the p+ layers 30, 31 that are to be provided with metal contacts are then uncovered. Contact holes resulting from this are given the reference 34 in FIG. 15. It should be understood here that contact holes 34 are formed on both sides of the layer 32 only when such a layer 32 is provided and/or each layer 32 is to be connected on both sides to a respective contact surface 16 (FIG. 1) or the like. Since in the exemplary embodiment the two right ends of the layers 32 in FIG. 13 are connected by the p-conductive layer 31, only the left contact hole 34 in FIG. 15 is required here.

Subsequently to this, the entire surface of the silicon slice 26 is provided with a metal layer 35, e.g. with a 0.8 µm thick aluminium layer applied by magnetron sputtering, which is then etched away using a suitable etchant (e.g. phosphoric acid) wherever it is not needed. Therefore, there only remain the actual strip conductors 35 and contact surfaces 36 FIG. 16), which correspond to strip conductors 15 and contact surfaces 16 in FIG. 1. Strip conductors 23 and contact surfaces according to FIG. 10 can be produced in a corresponding manner.

Where necessary, a further very highly doped zone 37 (p++) can be incorporated into the lead 14 (FIG. 8), preferably by increased boron diffusion, to improve the contacting.

The device 3 is now produced in a further process step. For this purpose, depressions 38 and 39 (FIG. 17) are configured from the upper wide side of the silicon slice 26 by means of further lithographic and etching steps. The depression 38 is configured in the location where the opening 7 is provided in FIG. 2, whereas the depression 39 is arranged in the portion of the surface of the silicon slice 26 that surrounds the U-shaped frame comprising parts 4, 5 and 6 in FIG. 2. The depressions 38, 39 are given a depth of 2 µm to 10 µm, for example, which corresponds to the thickness D of the second element 8. Therefore, after completion of the depressions 39, 39 all that remains on the part of the silicon slice 26 still remaining at this location is a web 40 running around in a U shape that projects in a raised manner from the base of the depressions 38, 39 and contains the layers 30 to 32 produced according to FIGS. 11 to 16, which form the detectors 12 and their connections in the finished component. The etching step is performed with usual etchants for $SiO_2$, Si and the photoresist to be removed ultimately.

Figure 18:
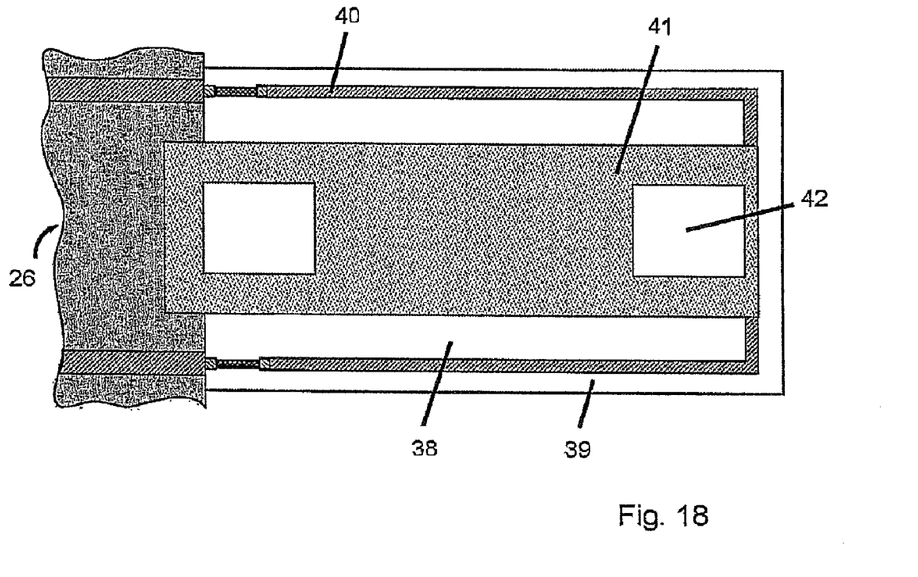

The second element 8 is now applied from the upper wide side of the remaining silicon slice 26. For this, a 50 nm to 100 nm thick layer of an etching stop, e.g. silicon nitride ($Si_3N_4$), is applied to the base and walls of the depressions 38, 39. Subsequently to this, the surface of the silicon slice 26 is photolithographically masked and provided with a window, which only exposes that part of the depression 38 located inside the web 40 that is to accommodate the second element 8 to leave the gap with the width a (FIG. 2). A material layer later forming the second element 8 is then inserted into the depression 38. In the case of SU-8, which is a polymer or varnish and has the properties of a negative resist, the material is applied in liquid form. After a masking and exposure step, only a layer 41 of material filling a central portion of the depression 38 then remains, as is shown in FIG. 18 in an enlarged view on the basis of the part of the silicon slice 26 containing the web 40. Where required, holes 42 corresponding to holes 11 according to FIGS. 1 and 2 can be provided in the layer 41 by appropriate masking.

A layer 43 of gold or the like is then deposited on the layer 41 by a further lithographic and deposition process. This layer 43 forms the absorber 10 according to FIGS. 1 and 2.

Figure 17:
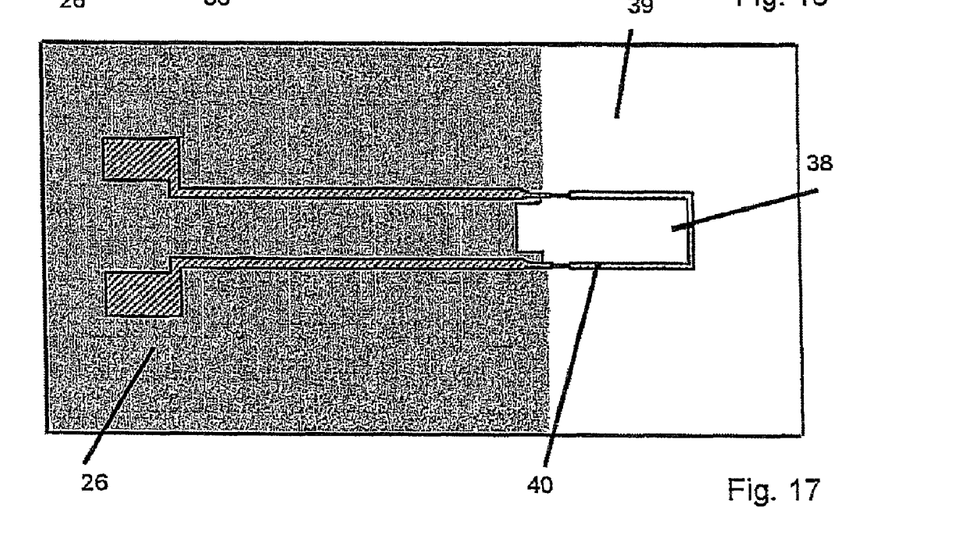
Figure 19:
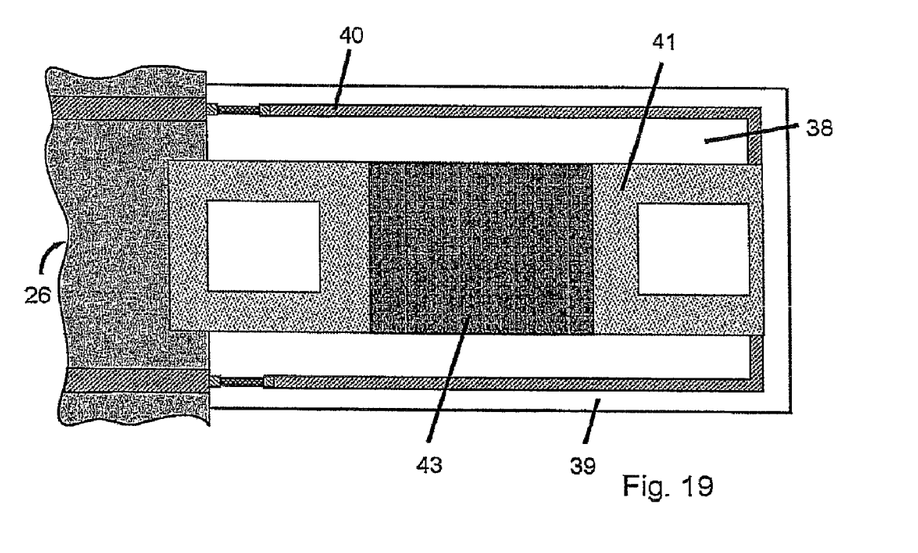

For completion of the component, the silicon slice 26 is now etched, e.g. with potassium hydroxide (KOH), from its rear side in the region that still has the depressions 39 and partially also depression 38 evident from FIGS. 18 and 19. The etching step is firstly conducted until the region of the depression 38 provided with the $Si_3N_4$ layer is reached. At this point in time, all the silicon material situated below the depressions 38, 39 in FIG. 17 is removed and only the web 40 and the layer 41 framed by this is present. The etching step is then continued for a certain length of time to thus thin out the web 41 to a dimension corresponding to the dimension d (cf. FIG. 4, for example). The $Si_3N_4$ layer deposited previously on the base of the depression 38 serves as etching stop here and, because it is resistant to KOH, prevents the base and outer walls of the layer 41 from also being attacked and therefore also being thinned out by the etching step. Therefore, at the end of the etching step the web 40 has the thickness d and the layer 41 has the thickness D (FIG. 4) corresponding to the depth of the depression 38.

Finally, remaining $Si_3N_4$ layers are selectively removed, e.g. with phosphoric acid, and the component described on the basis of FIGS. 1 to 9 is thus finished.

Figure 20:
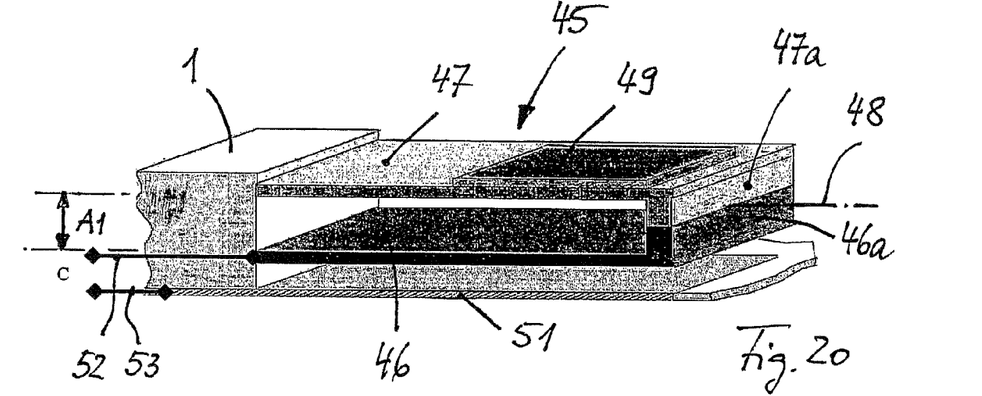
FIGS. 20 and 21 are perspective views of a second exemplary embodiment of the component according to the invention.
Figure 21:
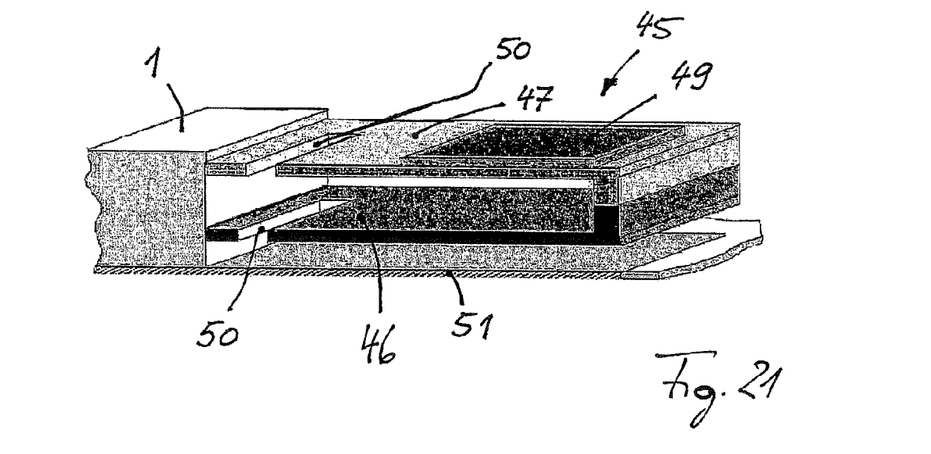

FIGS. 20 and 21, in which identical parts have been given the same references as in FIGS. 1 to 10, show a second exemplary embodiment of the microsystem component according to the invention. As in FIGS. 1 to 9, this component contains the base and holding body 1, to which a longitudinal end of a deformable device 45 is rigidly secured, whereas the opposite longitudinal end of the device 45 is arranged to be freely movable. The device 45 contains at least one first bendable element 46 and at least one second bendable element 47. Both elements 46, 47 preferably comprise plate-shaped and elongated components of essentially the same size that according to FIGS. 20 and 21 are arranged parallel to one another and parallel to a common centre plane 48 indicated by a line. In addition, both elements 46, 47 are arranged at a clearance A1 from one another and at free ends remote from the base body 1 are fixedly connected to one another at facing end sections 46a, 47a projecting above the respective plate surface. These end sections 46a, 47a at the same time act as spacers, so that the clearance A1 is preferably constant over the entire width and length of the elements 46, 47. It is understood here that the connection of the elements 46, 47 could also be achieved by other means than the end sections 46a, 47a. Finally, FIGS. 20 and 21 show that the elements 46, 47 are comparatively long and wide parallel to the centre plane 48, but perpendicular thereto they have a comparatively small width so that the device 45 acts as a cantilever clamped on one side.

As in FIGS. 1 to 19, the first and the second element 46, 47 have different coefficients of expansion and thermal conductivities. In particular, the elements 46, 47 can be made of the same materials as described above on the basis of FIGS. 1 to 19 for the first elements 4, 5 and the second elements 8. Accordingly, the first element 46 is made of a semiconductor material such as silicon, for example, while the second element 47 is made of a polymer, for example, in particular the material SU-8 explained above. Finally, the upper wide side of the second element 47 remote from the first element 46 is fitted with an absorber 49 corresponding to the absorber 10 according to FIGS. 1 and 2.

During the heating of the second element 47 or absorber 49 by a radiation, in particular an IR radiation, the two elements 46, 47 expand to different degrees, in a similar manner to FIG. 9, as a result of which the deformable device 45 bends upwards or downwards transversely to the centre plane 48 or in the direction of the thickness of the elements 46, 47, and in the exemplary embodiment bends predominantly downwards. In order to prevent the absorbed heat from discharging to the base body 1, the elements 46, 47 can be provided with recesses or holes 50 (FIG. 21), which have the same effect as the holes 11 described on the basis of FIGS. 1 to 19. Otherwise, the same essentially applies with respect to the configuration and production of the component according to FIGS. 20 and 21 as to the component according to FIGS. 1 to 19.

To measure the bending of the device 45 according to FIGS. 20 and 21, in contrast to measurement using piezoresistive detectors that is also possible here, a capacitive measurement method is shown as example. For this, an additional plate-shaped comparatively bend-resistant metal electrode 51 is arranged parallel to the elements 46, 47 on the wide side of the first element 46 remote from the second element 47 and is secured to the base body 1, whereas the first element 46 is either made completely of metal or is provided on the wide side facing the metal electrode 51 with an electrically conductive layer, which can also be obtained, for example, by a high doping level of the semiconductor material. As a result, the element 46 and the metal electrode 51 form the two plates of a capacitor, the capacitance of which changes with the spacing thereof, i.e. with the bending state of the device 45 generated by the effect of heat. This change in capacitance can be determined by means of generally known measurement methods by subjecting the element 47 and the metal electrode 51 to electric currents and/or voltages via suitable supply leads 52, 53.

Like the component according to FIG. 10, the component according to FIGS. 20 and 21 can be used as an actuator, for example, by providing the second element 47 with an electric heating element.

Figure 22:
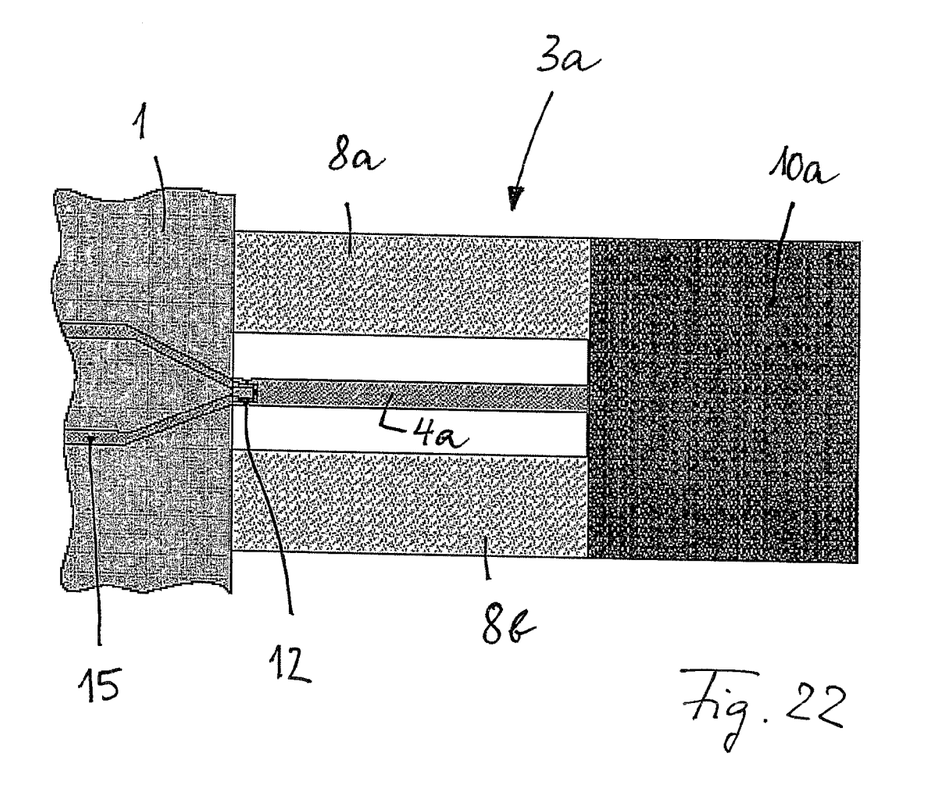
FIG. 22 is a plan view onto a third exemplary embodiment of the invention.

The invention is not restricted to the described exemplary embodiments that can be modified in a variety of ways. This applies in particular to the specified shapes, dimensions and materials of the components according to the invention. The shape of the frame can also be different. For example, in plan view the frame could be square, semicircular, semi-ellipsoidal, triangular or of another shape instead of rectangular as in FIG. 2. Moreover, one of the elements 4, 5 can be omitted completely. It would also be possible to form a frame of a deformable device 3a according to FIG. 22, in which identical parts have been given the same references as in FIGS. 1 and 2, with two second elements 8a and 8b, the free ends of which are connected to an end section corresponding to the end section 6 (e.g. FIG. 2), and to arrange at least one first element 4a in the central portion of the frame where element 8 lies in the exemplary embodiment according to FIGS. 1 to 19. An absorber 10a (or a heating element) could be provided on the end section connecting elements 8a, 8b in this case. The deflection of the device 3a in this case also occurs substantially perpendicularly to the centre plane of the frame formed from parts 8a, 8b and 4a. As in the case in FIGS. 1 to 9, the second elements 8a, 8b are preferably wider and thicker than the first elements 4a.

Besides the preferred SU-8, numerous other materials are possible for use as materials for the second element 8, 8a, 8b, in particular different polymers such as polypropylene, polyethylene and polystyrene, for example, which compared to SU-8 have higher coefficients of thermal expansion and in some cases also lower thermal conductivities. Furthermore, the described production process serves only as example, since there are numerous other methods for the production of the components and their parts. In addition, the different components are preferably not produced individually, but in large numbers at the same time on a common silicon slice. Moreover, it is understood that the different features can also be applied in other combinations to those illustrated and described.

The invention claimed is:

1. Microsystem component with a device, which is deformable under the effect of temperature changes and contains two rod- or plate-shaped first bendable elements arranged substantially parallel with one another and with a longitudinal axis of the device, and at least one second bendable element,
    wherein these elements are arranged spatially separated from one another, are rigidly secured at one end, have different coefficients of thermal expansion and different heat conductivities and are arranged and connected to one another in such a manner that the device assumes a bending state that is dependent on the temperature, wherein respective freely movable ends of the two first elements are firmly connected to one another by an end section to form a frame, wherein the second element is arranged between the two first elements and connected at another end to the end section and wherein in said bending state, said end section undergoes deflection transverse to the longitudinal axis.

2. Component according to claim 1, characterised in that it is configured as a sensor for measuring temperature changes caused by electromagnetic radiation.

3. Component according to claim 2, characterised in that the sensor is configured as an IR sensor.

4. Component according to claim 2, characterised in that at least one of the two elements is provided with an absorber for the radiation.

5. Component according to claim 1, characterised in that it is configured as an actuator, which can be operated as a result of temperature changes.

6. Component according to claim 5, characterised in that at least one of the elements is provided with a heating element.

7. Component according to claim 6, characterised in that the frame has a rectangular basic shape.

8. Component according to claim 6, characterised in that the elements are configured such that the device is deformed transversely to a centre plane of the frame.

9. Component according to claim 8, characterised in that the device is bent transversely to a common centre plane of the elements.

10. Component according to claim 1, characterised in that each first element has a substantially smaller width (b) than the second element.

11. Component according to claim 10, characterised in that each first element has a width (b), which is at least 10-times smaller than the width (B) of the second element.

12. Component according to claim 1, characterised in that each first element has a smaller thickness (d) than the second element.

13. Component according to claim 1, characterised in that the first element has a higher coefficient of thermal expansion and a lower thermal conductivity than the first element or the first elements.

14. Component according to claim 4, characterised in that the second element is provided with the absorber and this has a high thermal conductivity.

15. Component according to claim 14, characterised in that the second element has a hole intended for thermal insulation in at least one region located between the absorber and one of the ends.

16. Component according to claim 1, characterised in that at least one first element is provided with at least one piezoresistive detector intended for measurement of its bending state.

17. Component according to claim 1, characterised in that it has an associated electrode intended for capacitive determination of the bending state of the device.

18. Component according to claim 1, characterised in that at least one first element is made of silicon.

19. Component according to claim 1, characterised in that the second element is made of a polymer, in particular an epoxy resin.

20. Component according to claim 19, characterised in that the epoxy resin has a coefficient of thermal expansion of approx. $52 \cdot 10^{-6} \cdot K^{-1}$ and a thermal conductivity of approx. 0.2 W/mK.

21. Component according to claim 4, characterised in that the absorber is made of a material sensitive to a preselected wavelength of the radiation.

22. Component according to claim 4, characterised in that absorber is made of gold.

* * * * *